United States Patent [19]
Shimakura et al.

[11] Patent Number: 5,219,632
[45] Date of Patent: Jun. 15, 1993

[54] COMPOUND SEMICONDUCTOR SINGLE CRYSTALS AND THE METHOD FOR MAKING THE CRYSTALS, AND SEMICONDUCTOR DEVICES EMPLOYING THE CRYSTALS

[76] Inventors: Haruhito Shimakura; Gaku Kano; Hiromasa Yamamoto; Osamu Oda, all c/o Nippon Mining Co., Ltd Denshizairyo-Buhin Kenkyusho, 17-35, Niizominami 3-chome, Toda-shi, Saitama 335, Japan

[21] Appl. No.: 442,347
[22] PCT Filed: Feb. 23, 1989
[86] PCT No.: PCT/JP89/00183
  § 371 Date: Oct. 20, 1989
  § 102(e) Date: Oct. 20, 1989
[87] PCT Pub. No.: WO89/08158
  PCT Pub. Date: Sep. 8, 1989

[30] Foreign Application Priority Data
Feb. 24, 1988 [JP] Japan ............... 63-42508

[51] Int. Cl.$^5$ .............................. B32B 13/02
[52] U.S. Cl. .................... 428/64; 428/156; 428/172; 428/219; 428/409; 428/688; 148/DIG. 84; 437/247; 437/248; 437/939; 437/949
[58] Field of Search .......... 428/219, 64, 409, 156, 428/172, 688; 437/226, 227, 247, 939, 949, 248; 148/DIG. 84

[56] References Cited

U.S. PATENT DOCUMENTS

| | | | |
|---|---|---|---|
| 3,737,282 | 6/1973 | Hearn | 437/939 |
| 4,016,006 | 4/1977 | Yoshinaka | 437/247 |
| 4,713,354 | 12/1987 | Egawa | 437/247 |
| 4,750,969 | 7/1988 | Sassa | 156/606 |
| 4,851,358 | 7/1989 | Huber | 437/248 |
| 4,885,257 | 12/1989 | Matsushita | 437/247 |
| 4,889,493 | 12/1989 | Otsuki | 437/939 |
| 4,897,141 | 1/1990 | Girard | 437/226 |
| 4,929,564 | 5/1990 | Kainosho | 437/247 |
| 5,051,376 | 9/1991 | Yamada | 437/248 |

FOREIGN PATENT DOCUMENTS

| | | | |
|---|---|---|---|
| 28375 | 7/1981 | Japan | 437/939 |
| 55612 | 3/1985 | Japan | . |
| 118687 | 6/1985 | Japan | . |
| 222999 | 10/1986 | Japan | . |

OTHER PUBLICATIONS

Improved Uniformity of LEC Undoped Gallium Arsenide Produced by High Temperature Annealing, D. Rumsby et al., Cambridge Instruments Limited, Cambridge, England, GaAs IC Symposium, pp. 34–37, 1983.
Etching Characteristics of (001) Semi-Insulating GaAs Wafers, Y. Okada, Japanese Journal of Applied Physics, vol. 22, No. 3, Mar. 1983, pp. 413–417.

Primary Examiner—Ellis P. Robinson
Assistant Examiner—Nasser Ahmad
Attorney, Agent, or Firm—McAulay Fisher Nissen Goldberg & Kiel

[57] ABSTRACT

According to the present invention, an ingot of the compound semiconductor single crystal grown by the LEC method or the HB method, or a block/blocks or wafers cut from the ingot is subjected to a high temperature annealing at any temperature in the range not less than 1100° C. and not more than the melting point, and then the ingot is cooled at the cooling rate of 15°~30° C./min. This method ensures that the egg-shape etch pit density revealed in the single crystal by AB etchant is $5 \times 10^4$ cm$^{-2}$ or less, preferably $5 \times 10^3$ cm$^{-2}$ or less. As a result, the device employing the single crystal as its substrate can be possessed of homogeneous property.

12 Claims, 5 Drawing Sheets

2: Quartz Ampul
3: Wafer
1: Wafer Base

COMPOUND SEMICONDUCTOR SINGLE CRYSTALS AND THE METHOD FOR MAKING THE CRYSTALS, AND SEMICONDUCTOR DEVICES EMPLOYING THE CRYSTALS

TECHNICAL FIELD

The present invention relates to compound semiconductor single crystals and wafers for improving the homogeneity of the device properties when used as substrates and a method for producing the compound semiconductor single crystals and wafers and, more particularly, the invention relates to a heat treatment method for single crystals after growing of the single crystals.

BACKGROUND TECHNIQUE

Various methods for producing compound semiconductor single crystals are well known. For example, a seed crystal is immersed in a melted solution of the crystal and then the seed crystal is pulled up to grow the single crystal from the seed crystal. As an alternative method, the melted solution is gradually solidified to grow the single crystals. Particularly, GaAs single crystals are produced in an industrial scale by the Liquid Encapsulated Czochralski Method (LEC Method) which belongs to the former method, and by the Gradient Freeze Method (GF Method), Horizontal Bridgeman Method (HB Method), and the Vertical Bridgeman Method (VB Method), which belongs to the later method.

Although these single crystal growth methods each are a little different from each other, crystals are grown in a basically similar process such that the temperature gradient between the crystal and the melted solution is generated to gradually solidify the melted solution. In the process, the interface between the liquid and the solid where the crystal is grown is kept at the melting point, but the part of the crystal already grown is kept at the lower temperature than the melting point. Accordingly, these single crystal producing methods can not avoid the production of inhomogeneous single crystals.

Conventionally, the compound semiconductor single crystals produced by these producing methods have been used as various optoelectric devices such as light emitting diodes, laser diodes, and photo-detectors; and various substrates for high speed devices such as FET (Field Effect Transistor). Further the compound semiconductor single crystals have been expected to be used as substrates for OEIC (Optoelectronic Integrated Circuit) on the same substrate of which optoelectric devices and FETs are fabricated.

As disclosed above, however, these single crystal producing methods can not essentially avoid the production of the single crystals with inhomogeneous properties. Thus the devices employing the single crystals produced by these methods would remarkebly scatter in their properties depending on the single crystal wafer used in the devices. Particularly in the production for discrete high frequency FETs and digital ICs, this scattering in the crystal property would cause a decrease the yield rate of the products. This fact has been realized as one of the reasons why the compound semiconductor device has not been broadly used.

This scattering would be caused by various factors, for example dislocations generated in the crystal. In order to eleminate the dislocations some impurities such as In have been doped in the crystal.

In addition to the above method, Rumsby provided the method for annealing the single crystal ingot at a high temperature to decrease the scattering in the crystal property. Thereafter various inventions relative to this ingot-annealing method have been provided; for example, Japanese Patent Application Laid-Open Publication No. 62-21699 and No. 62-21800.

Conventionally, the ingot-annealing has been carried out at temperatures 138° C. lower than the melting point. If the crystal ingot is subjected to the annealing at high temperatures than the above level, many defects would be generated in the annealed ingot. In detail, even if the whole of the ingot is heated at an uniform temperature during the annealing process, the ingot can not be uniformly cooled and thus thermal stress would be generated in the crystal by the cooling process after the annealing process. This thermal stress would cause an increase in the dislocation density which is generally called as EPD (Etch Pit Density) in the ingot, or slip lines due to the dislocation introduced from the periphery of the ingot. While the increase of EPD and the generation of the slip lines can be prevented by delaying the cooling speed, the period of the ingot staying under the low temperature condition would be prolonged so that new defects would be generated. Thus newly generated defects would spoil the homogeneity of crystal properties. On the other hand, when the ingot is subjected to the annealing at high temperatures, the high vapor pressure element of the crystal such as As would possibly volatilize from the crystal. According to the above reasons, conventional ingot annealing has been carried out at temperatures 138° C. lower than the melting point.

Other heat treatment methods for GaAs single crystals have been conventionally proposed. For example, J. Lagowski at al. have reported that a GaAs single crystal wafer can be subjected to heat treatment at temperature range from 1100° to 1200° C. for 8 to 16 hours and then rapidly cooled to a room temperature within 2 or 3 seconds to decrease the EL2 concentration of GaAs, referring to "Inverted Thermal Conversion-GaAs, a New Alternative Material for Integrated Circuits" Appl. Phys., Lett, 49, (1986)892. However, this method requires ultra-high speed cooling at a cooling rate of 10000° C./min would produce GaAs with a dislocation density of $10^7 cm^{-2}$ which can not be practically applied for device fabrication.

Further, A. K. Chin et al. have reported that GaAs single crystal ingot is subjected to heat treatment at 1200° C. for 6 hours and then gradually cooled at a cooling rate of 50° C./h (=0.8° C./min), referring to "Effects of thermal annealing on semi-insulating undoped GaAs grown by the liquid-encapsulated Czochralski technique" J. Appl. Phys. 57(6), 15 Mar. 1985. However, this method can not satisfy the object of the present invention, described later; i.e., to decrease the number of egg-shape etch pits revealed by AB etchant.

While a conventional In-doping method can eliminate the generation of dislocation in the single crystal, it can not sufficiently decrease the scattering of the device properties. Further, the above described conventional ingot-annealing method provides some effect to decrease the scattering in the crystal properties, but it is not sufficient.

The object of the present invention is to provide compound semiconductor single crystals or the wafers which can improve the homogeneity of the device properties when they are used as the substrates and the method for producing these materials.

DESCRIPTION OF THE INVENTION

To accomplish the above objects, for the compound semiconductor single crystals or their wafers or blocks cut from the single crystals according to the present invention, the density of egg-shape etch pits in the crystal revealed by AB etchant is made $5 \times 10$ cm$^{-2}$ or less, preferably $5 \times 10^3$ cm$^{-2}$ or less.

The inventor has repeated various experiments on the compound semiconductor single crystals grown by the LEC method and the device fabrication such as FETs employing the single crystals to find out the reason for large scattering in the device properties. According to these experiments, the inventor has estimated that the reason would be based on another factor more complicated rather than the dislocation density, and has taken note of microscopic defects in the crystal. Since the microscopic defects are sensitive to a chemical etching solution, the electrodes of FETs were removed by etching and then its wafer was subjected to etching with various etchants. The etched wafer was checked to see the relationship between the etch pit appeared under the gate of each FET and their property. That is, the inventor observed the difference between the etch pit existing between the FET with good property and with poor property. It was found that the FET treated with AB etchant (2 ml H$_2$O; 8 mg AgNO$_3$; 1 g CrO$_3$; 1 ml HF) provided poor property when egg-shape etch pits were appeared under the gate of FET.

Figure 1A:
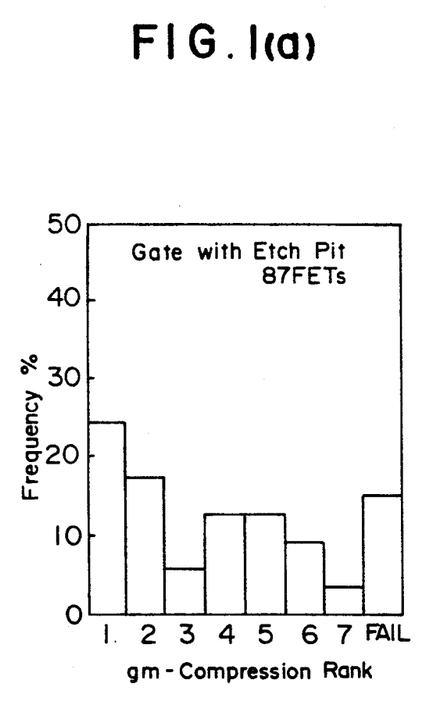
FIG. 1(a) and FIG. 1(b) are histograms showing the relationship between the gm compression ranks and the existence of egg-shape etch pits revealed under the gate of FET.

198 samples of FET were subjected to a gm-compression test. The resulting data are shown in FIG. 1 (a) and (b); FIG. 1(a) shows the samples with egg-shape etch pits as they under the gate which are represented in the rank of gm-compression, and FIG. 1(b) shows the samples without egg-shape etch pits in the same manner.

Figure 1B:
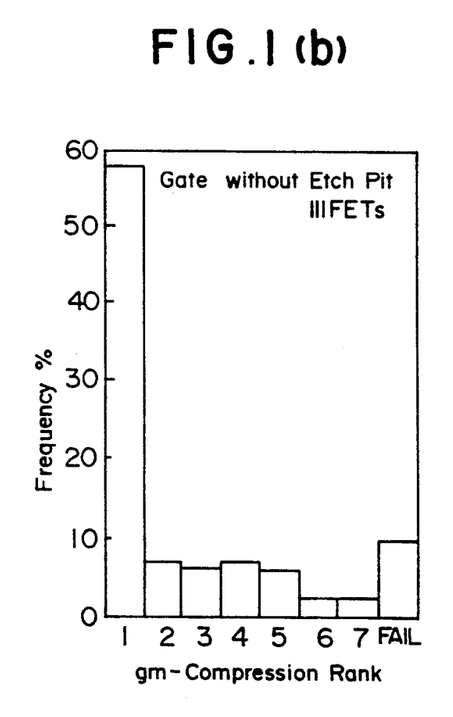

In FIG. 1, the value of gm-compression is ranked as set forth in the following table 1.

TABLE 1

| Rank | gm-Compression |
|---|---|
| 1 | 0.5–1.0 V |
| 2 | 1.0–1.5 V |
| 3 | 1.5–2.0 V |
| 4 | 2.0–2.5 V |
| 5 | 2.5–3.0 V |
| 6 | 3.0–3.5 V |
| 7 | 3.5–4.0 V |

According to the experimental result, the inventor concluded that FET device with poor property depends on the segregation of some impurities or precipitated material such as As which can be revealed by etching with AB etchant, and it does not depend on the dislocation.

While it has been commonly known that egg-shape etch pits are revealed in GaAs single crystals by AB etchant, the relationship between FET device property and the existence of egg-shape etch pits; particularly, FET device property directly depends on the existence of the egg-shape etch pit, has been firstly realized by the inventor. It has been estimated that this egg-shape etch pit is identified with As precipitates, but this relationship has not been experimentally confirmed. The GaAs single crystal used in the experiment by the inventor was grown from the melt composition ratio As/(Ga+As)=0.5002 without stoichiometric difference in the crystal. Accordingly, the inventor has estimated that the egg-shape etch pits corresponds to some impurities precipitated in GaAs crystal, not the As precipitates.

As is clear from the experiments performed by the inventor, the scattering of FET property will become remarkable in response to the existence of this egg-shape etch pit. Therefore, the egg-shape etch pit should be eliminated from the crystal. The inventor tried to carry out the ingot annealing at temperatures higher than conventionally employed temperature which is 138° C. lower than the melting point according to the estimation that the egg-shape etch pit corresponds to precipitated and segregated some impurities. This experiment showed unexpected results that the egg-shape etch pits can be mostly eliminated by the ingot annealing at the temperature just below the melting point.

According to the above experiments and discovery, the inventor proposes here a single crystal capable of improving the device property and the method for producing the single crystal.

A compound semiconductor single crystal ingot grown by the LEC method or the HB method, or a cut piece of the ingot is subjected to a high temperature annealing process at any temperature in the range from the temperature just below the melting point to the temperature 138° C. lower than the melting point, and then cooled at a cooling speed of 15° to 30° C./min.

On the other hand, the compound semiconductor single crystal grown by commonly used method is cut into blocks or wafers, and these cut pieces are subjected to a high temperature annealing process at any temperature in the range from the temperature just below the melting point to the temperature 138° C. lower than the melting point, and then cooled at a cooling speed of 15° to 30° C./min.

These methods can remarkably reduce the density of egg-shape etch pits; i.e., microscopic defects affecting the device property. Further, in the case of the heat treatment for the crystal in a block or wafer shape, the temperature distribution in the crystal can be maintained in a homogeneous state under the high temperature condition. This causes to prevent the crystal from generating thermal stress and generating dislocation, so that the crystals with the homogeneous property can be produced.

BEST MODE FOR EMBODING THE INVENTION

1. First Embodiment

GaAs single crystals grown by the LEC method are cut into blocks each of which has a thickness of 30 to 40 mm and are shaped into a cylinder. Then each of the blocks is subjected to degreasing and etching. Thereafter, the block is sealed in a quartz ampoule in vacuum. This ampoule is set in a resistance heater furnace and maintained at a temperature between 1100° C. and 1235° C. for 5 hours. Then the ampoule is cooled at a cooling speed of 20° C./min. A core tube of the furnace is made of quartz or alumina. The interia of the tube is evacuated or in the ambient atmosphere pressure. A thermocouple is set on the external surface of the quartz ampoule to always monitor the temperature at the quartz ampoule during the annealing process for a predetermined period and a cooling process at a constant cooling speed. The quartz ampoule is cooled down to a room temperature and then taken out of the furnace.

Figure 2:
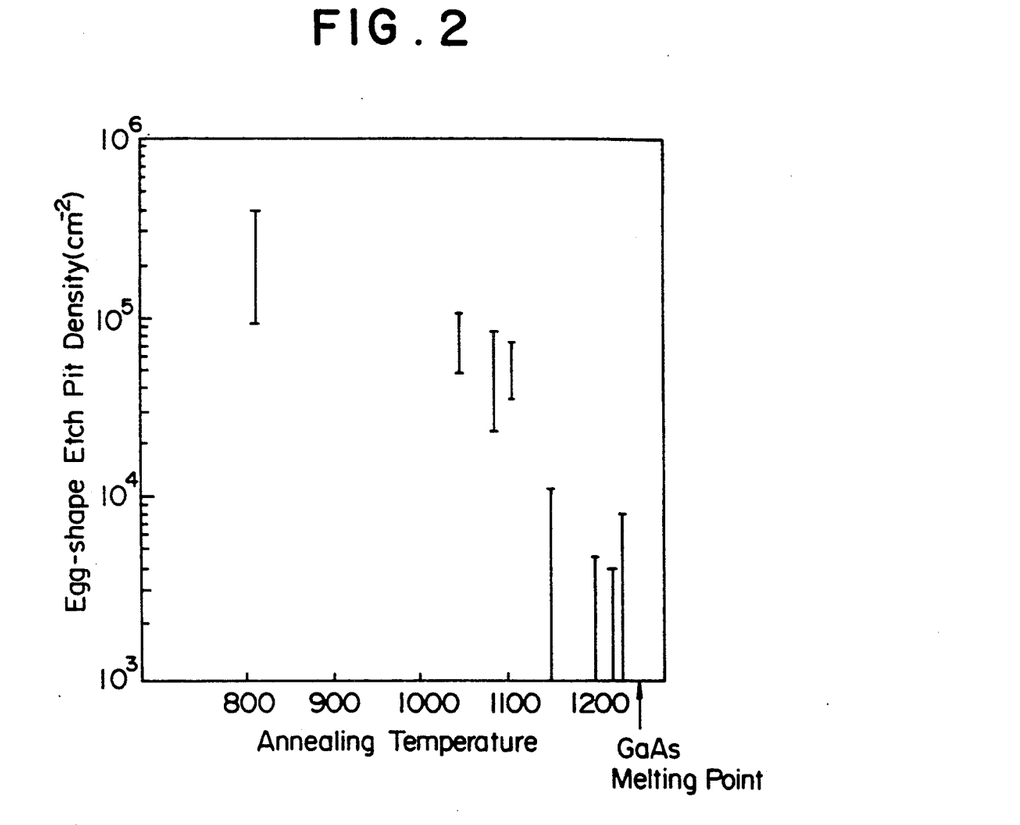
FIG. 2 is a graph showing the scattering of egg-shape etch pit density in the GaAs single crystal produced by a first embodiment according to the present invention.

For example, the crystals were heat-treated at the annealing temperatures of 1150° C., 1200° C., 1220° C., 1230° C. On the other hand, for comparison, the same test was carried out at the annealing temperatures of 800° C., 1040° C., 1080° C., 1100° C. Every annealing temperature was kept for 5 hours and every cooling speed was 20° C./min. The annealed blocks were respectively cut into wafers, and the wafers were subjected to lapping and mirror surface etching. Thereafter, the wafers were further subjected to etching by AB etchant at room temperature for 5 min. Every wafer was checked with respect to whether egg-shape etch pits were revealed, and the revealed egg-shape etch pits were observed by a microscope by the 400 magnification to count the egg-shape etch pits within the visual field of the microscope. Each observation was started from the central position of the wafer towards its edge at intervals of 5 mm. This result is shown in FIG. 2 in which the relationship between the ingot annealing temperature and the counted number of the revealed egg-shape etch pits.

For comparison, a non-annealed crystal ingot was also observed to count the revealed egg-shape etch pits. The result was $(1\sim5)\times10^5$ cm$^{-2}$. The substantially similar result was provided from the low temperature annealed ingot. On the other hand, the result of the high temperature (in the range from the temperature just below the melting point to the temperature 138° C. lower than the melting point) annealed ingot according to the present invention showed remarkably decreased egg-shape etch pit density; i.e., $(0\sim5)\times10^4$ cm$^{-2}$.

The cooling speed (15~30° C./min) for the annealed crystals was so determined as to prevent the generation of slip lines and to prevent the occurrence of property inhomogeneity when the crystals pass at lower temperature.

In this embodiment, the cooling speed was determined by the following experiment.

A GaAs crystal ingot was subjected to annealing at 1150° C. for 5 hours, and cooled at various cooling speeds in the range form 1° C./min to 1000° C./min. The crystal ingot was cut into pieces and their surface were subjected to a mirror surface finishing. The cut pieces were observed by a microscope to measure their dislocation density and to count the egg-shape etch pits revealed by AB etchant. The dislocation density corresponds to the number of etch pits revealed after the etching by KOH.

Figure 5:
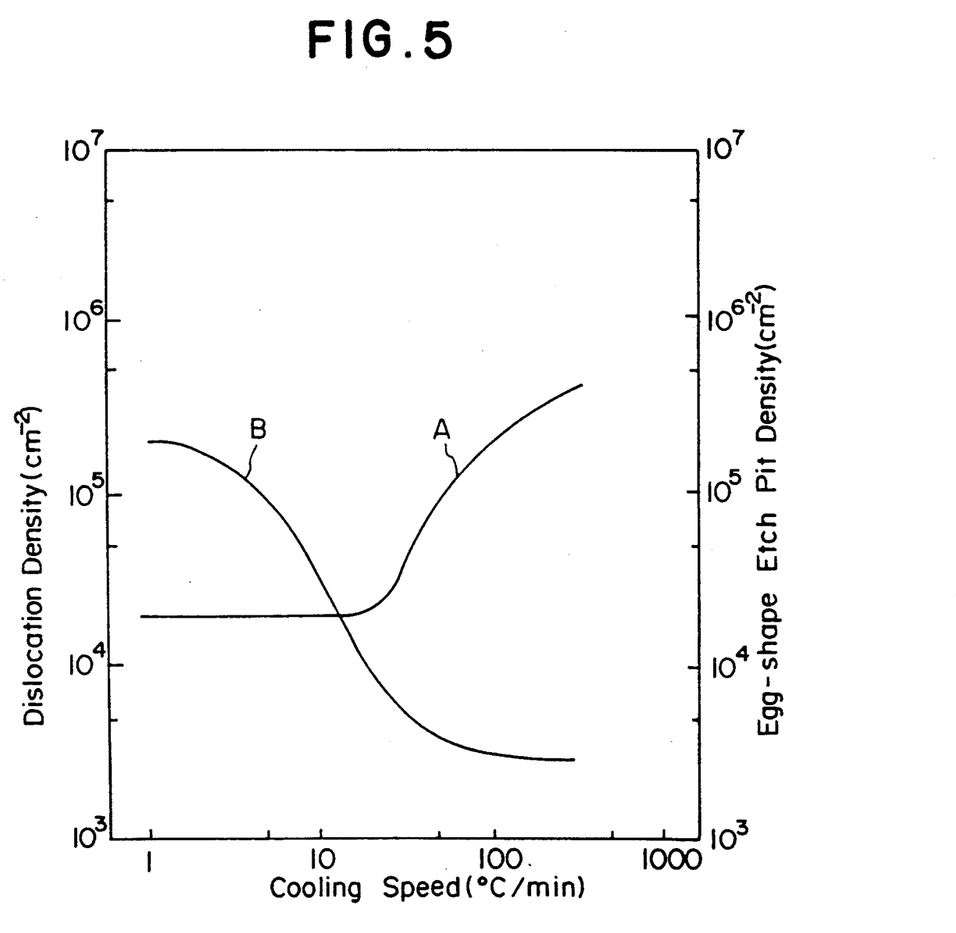

The measured result is shown in FIG. 5.

In FIG. 5, curve A represents the relationship between the cooling speed and the dislocation density, and curve B represents the relationship between the cooling speed and the egg-shape etch pit density (AB-EPD). The curves show that the dislocation density is extremely increased when the cooling speed is higher than 30° C./min and the egg-shape etch pit density is increased as the cooling speed is lowered. According to this result, the cooling speed is preferably selected in the range from 15° C./min to 30° C./min to make the dislocation density lower and effectively reduce the number of the egg-shape etch pits.

Next, the crystal block annealed at a high temperature was cut into wafers. The cut wafers were provided with Si ion implantation at 100 KeV with the dose of $2\times10^{12}$/cm$^2$. The wafers were subjected to capped annealing with $Si_3N_4$ layer and further annealed at 830° C. for 10 min for forming an active layer. On the active layer gate electrodes, source electrodes and drain electrodes were deposited to produce FETs. The source and drain electrodes were made of Au-Ge/Ni and the gate electrode was made of Ti/Pt/Au. The gate had a length of 2 μm and a width of 5 μm, and the interval distance between the source and the drain was 6 μm. The resulting threshold value Vth and its scattering σVth are shown in Table 2.

TABLE 2

| Annealing Condition and FET Property | | | | |
|---|---|---|---|---|
| (Conventional Method) | | | | |
| | 800° C. | 1040° C. | 1080° C. | 1100° C. |
| Vth | −1.03 V | −1.04 V | −1.02 V | −1.05 V |
| σVth | 72 mV | 64 mV | 73 mV | 57 mV |
| (Present Invention) | | | | |
| | 1150° C. | 1200° C. | 1220° C. | 1230° C. |
| Vth | −1.07 V | −1.05 V | −1.08 V | −1.04 V |
| σVth | 32 mV | 26 mV | 20 mV | 27 mV |

Further, on two crystal substrates one of which was produced by the conventional method and the other of which was produced by the invention, an updoped buffer layer and a Si-doped active layer were grown epitaxially by a chrolide CVD method. These epitaxial layer formed wafers were used to produce FET. The resulting FET were measured to obtain gm-compression values of each sample. The results are shown in Table 3.

The gm-compression value is defined as the absolute value of difference between the gate voltage providing $I_{DS}=0.1$, 10 mA under the relationship of $I_{DS}-V_G$ when $V_{DS}=3V$. This value is better as the value is smaller and its scattering is smaller.

TABLE 3

| | gm-Compression (V) | |
|---|---|---|
| | Average Value | σ |
| Conventional Method | 0.68 to 3.59 | 0.13 to 1.12 |
| High Temp. Annealing | 0.66 to 0.68 | 0.05 to 0.17 |

As is clear from Table 2 and Table 3, the device property with excellent homogeneity can be produced by the present invention. The annealed GaAs single crystal was measured to compare its cathode luminescence with that of conventionally produced GaAs single crystal. The annealed crystal had the luminescence intensity with improved homogeneity in comparison with the conventional one, even though the data is omitted.

2. Second Embodiment

According to the second embodiment of the present invention, a compound semiconductor single crystal was grown and cut into wafers, and the wafers were subjected to a high temperature annealing to reduce the number of egg-shape etch pits. This second embodiment will be described in detail.

The both ends of the grown single crystal ingot were cut and the crystal ingot was shaped into a cylinder. The cylindrical shape crystal ingot was cut into wafers by a cutter such as a slicer, a wire saw, a blade saw, and the like. Thickness of the wafer was 500 to 1000 μm. The thinner wafer was prefereble, but the cutting thickness was based on the required thickness of the mirror surface wafer after using a finishing process such as lapping, polishing and the like.

The wafer surface was then degreased and washed to remove stain, lubricant, fine sand particles and so on from the surface. In this embodiment, a scrubber and a supersonic cleaner were used, and if necessary, the wafer may be subjected to etching. The finished wafer after lapping and polishing may be also annealed, but the non-treated wafer without the finishing process is preferable to reduce process-steps because the wafer after annealing should be subjected to the finishing process.

Figure 3A:
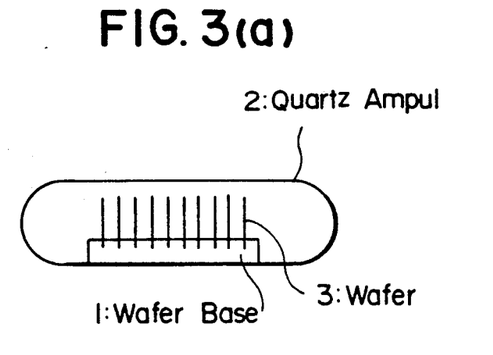
FIG. 3(a) to FIG. 3(d) are schematic views showing various arrangements of wafers in a vacuum ampoule according to a second embodiment.
Figure 3B:
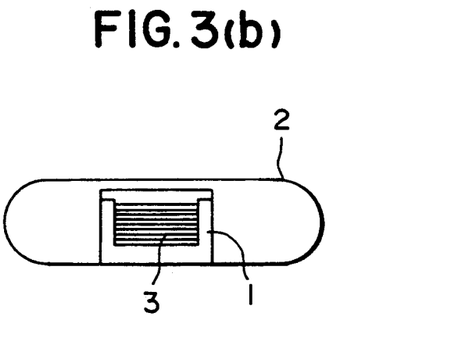
Figure 3C:
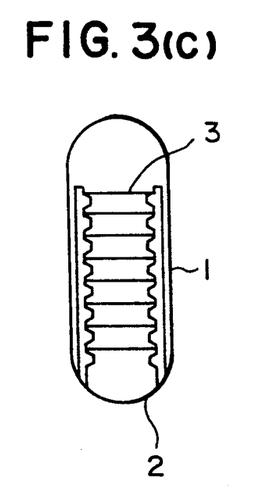
Figure 3D:
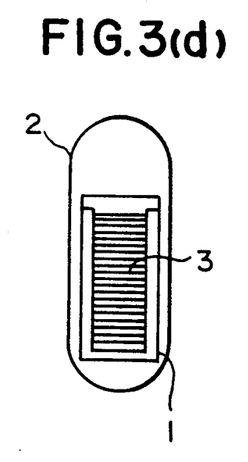

The wafers to be annealed were mounted on a wafer base 1 of a heat treating furnace and they are sealed in a quartz vacuum ampoule 2 as shown in FIG. 3(a). The wafers 3 were vertically standing on the base 1 at a regular interval distance. Alternatively, the wafers may be piled as shown in FIG. 3(b). On the other hand, if the vertical arranged heat treating furnace is used, the wafers 3 may be arranged in a ladder shape on the wafer base 1 at a regular interval as shown in FIG. 3(c), or piled as shown in FIG. 3(d).

The wafer base was made of thermal resistant oxides such as quartz, alumina, beryllia, boron nitride, magnesia, or the like, or graphite, molybdenum, tungsten, tantalum, or the like. It is preferable to minimize the fluctuation of the temperature at the interia of the furnace in which the wafer base is set.

It is preferable to carry out the annealing process in the vapor including one of the compositional element of the compound semiconductor. Generally, in the compound semiconductor such as GaAs, InP, GaP, CdTe, ZnSe, V group elements (As, P) and Cd, Se which are their compositional elements have large dissociation pressures. Accordingly, if the vapor pressure of these compositional elements in the ampoule during the wafer annealing process is lower than predetermined value, these volatile elements will evaporate from the wafer surface. This phenomenon will decrease the melting point of the evaporated portion and thus the wafer will be partially melted. To prevent this phenomenon, a certain pressure of the vapor including these volatile components should be applied into the ampoule by any one of the following manners.

(1) A block of the compound semiconductor crystal ingot is installed in the vacuum ampoule with the wafers to be annealed to apply a predetermined pressure by the volatile component dissociated from the block.

(2) A certain amount of the volatile component is previously set in the vacuum ampoule with the wafer to be annealed. In this manner, the volatile component will be wholly evaporated in the ampoule so that the vapor pressure corresponding to the wholly evaporated volatile component will be generated. This manner is the simplest and the most effective.

(3) Another compound semiconductor including the volatile component, different from the compound semiconductor to be annealed is set in the vacuum ampoule. For example, a certain amount of InAs is set with GaAs wafers to generate As vapor pressure by dissociation of InAs.

(4) One end of the vacuum ampoule is extended to form a reservoir in which the volatile component is previously set. The reservoir is heated by an externally arranged heater to control the temperature of the reservoir for generating the required vapor pressure. In this case, a partition plate is preferably arranged between the reservoir and the wafers to prevent the compound semiconductor to be annealed from evaporating.

Figure 4:
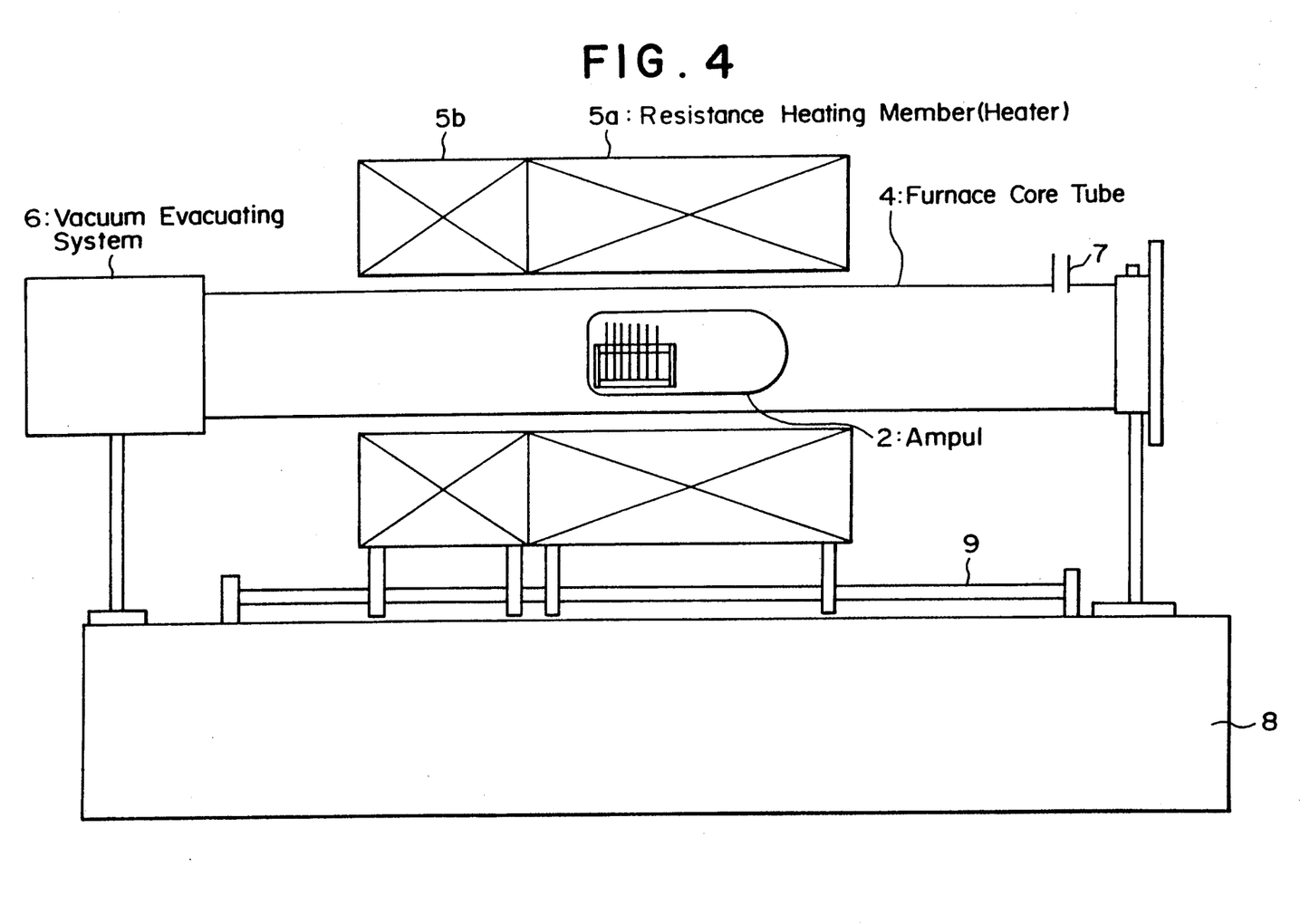
FIG. 4 is a schematic view showing a heat treating device used in a second embodiment; and, FIG. 5 is a graph showing the relationship among a cooling speed after annealing process, density of dislocations, and density of egg-shape etch pits.

FIG. 4 shows a schematic illustration of the wafer heat treating funace employed in this embodiment to anneal the wafers. This instrument comprises a transparent furnace core tube 4 made of quartz, a pair of resistance heating members (heaters) 5a, 5b arranged around the furnace core tube 4, and a vacuum evacuating system 6 connected to one end (the left end in this figure) of the furnace core tube 4. This is a horizontally arranged type furnace. The other end of the furnace core tube 4 is connected to a gas inlet 7 through which gas such as $N_2$, Ar, and the like is supplied into the tube 4. The resistance heating members 5a and 5b are mounted on a sliding rail 9 fixed on a frame 8 so that the heating members 5a and 5b can be horizontally moved along the tube 4.

As a sample, an undoped GaAs single crystal having a diameter of 3 inches produced by the LEC method was annealed by the above described furnace. The single crystal was shaped into a cylinder and then cut into wafers each of which has a thickness of 800 μm. The wafers were degreased and washed, and then subjected to etching with NaOH type etchant. The wafers were sealed with some As in the quartz ampoule 2 and evacuated, and this quartz ampoule 2 was set in the core tube 4. The core tube 4 was also evacuated and kept at predetermined temperatures (1110° C., 1150° C., 1200° C., 1220° C., 1235° C.) for 5 hours. After the annealing under this condition, the wafers were cooled at a cooling speed of 20° C./min.

The heat treated wafers having a diameter of 3 inches according to this embodiment was subjected to a mirror surface finishing and then etched with AB etchant for 5 min. The resulting wafers were checked as to whether egg-shape etch pits were revealed on their surface and the etch pit density of these wafers were measured. The measured etch pit density was $(0\sim5)\times10^3$ cm$^{-2}$ which is lower than that of the first embodiment.

As a result, the wafers prepared by this embodiment can remarkably reduce the etch pit density revealed by AB etchant. This ensures that FETs formed on the wafers with such low etch pit density have essentially homogeneous propery.

Table 4 shows the amount of scattering in the measured specific resistance and mobility of the wafers heat-treated according to the present invention and conventional wafers. The wafers were taken out of the ampoule and subjected to a mirror surface finishing process to shape the wafers into thickness of 600 μm. The wafers were respectively diced into 5 mm squares. According to the Van der Pauw method, these resulting wafers were measured to obtain the amount of scattering in the measured specific resistance and mobility in the plane represented by direction (110) passing through the center of wafer.

TABLE 4

| Type of Wafer | Scattering of Specific Resistance σ ρ | Scattering of Mobility σ μ |
|---|---|---|
| Present Invention | 9%-2% | 4%-1% |
| Conventional Art | 20%-8% | 18%-6% |

The amount of scattering $\sigma\chi(\chi=\rho, \mu)$ of each wafer was obtained from the following equation;

$$\sigma\chi = \sqrt{\sum_i (\chi^i - \overline{\chi})^2 / \overline{\chi}}.$$

In this equation, $$\overline{\chi} = \sum_i \chi^i / n, \quad n = \sum_i.$$

This represents the relative ratio for the average value of standard deviation obtained from the measured values on each wafer. According to Table 4, the method according to the present invention can reduce the scattering of specification resistance and the scattering of mobility to ½ to ¼ in comparison with the conventional method, and thus the homogeneity in the same plane is remarkabley improved.

Further, the samples were measured with respect to cathode luminescence. The GaAs single crystals produced by the present invention provided higher intensity rather than conventionally produced crystals, and improved homogeneity in the crystals. Especially, the homogeneity was superior to the samples produced by the first embodiment.

The slip lines which would be generated by the ingot annealing just below the melting point was not appeared at all in this embodiment.

As given explanation above, the present invention provides the compound semiconductor single crystal wafers whose egg-shape etch pit density revealed by AB etchant is $5 \times 10^4$ cm$^{-2}$ or less in the case of ingot annealing, and $5 \times 10^3$ cm$^{-2}$ or less in the case of wafer annealing. Therefore, such compound semiconductor single crystals will ensure that the device employing these single crystals as its substrate has extremely homogeneous property.

In the method according to the present invention, the grown crystal is subjected to the high temperature annealing process at any temperature in the range from the tempeature just below the melting point to the temperature 138° C. lower than the melting point, and then cooled at the cooling speed of 15~30° C./min. This method can remarkably reduce the egg-shape etch pit density; i.e., microscopic defects in the single crystals, the defects affecting the device property.

In the alternative method, the grown crystal is cut into ingots, blocks or wafers and the cut pieces are subjected to the high temperature annealing process at any temperature in the range from the temperature just below the melting point to the temperature 138° C. lower than the melting point. Then they are cooled at the cooling speed of 15~30° C./min. This method will ensure that temperature distribution in the crystal during the high temperature treatment is constant. This will prevent the crystal from generating with thermal stress, so that the dislocation in the crystal is not increased. As a result, the homogeneity in the crystal property can be achieved.

USABILITY IN INDUSTRY

As given explanation above, the present invention is the most effective for producing GaAs single crystal. The present invention is not only limited to produce GaAs single crystal, but can be commonly applied to produce InP, other III-V group compound semiconductor single crystals, and generic compound semiconductor single crystals.

We claim:

1. A method for producing a compound semiconductor single crystal grown from gallium arsenide having a melting point of 1238° C. by a liquid encapsulated Czochralski method having an egg-shaped etch pit density revealed in said crystal by an AB etchant of less than $5 \times 10^4$ cm$^{-2}$, wherein said grown compound semiconductor single crystal is heat-treated at a temperature in a range between not less than 1100° C. and not more than the melting point and then said crystal is cooled at a cooling rate between 15° C. to 30° C. per minute.

2. The method for producing a compound semiconductor single crystal according to claim 1, wherein said single crystal is formed in an ingot or a block/blocks cut from the ingot.

3. The method for producing a compound semiconductor single crystal according to claim 1, wherein said single crystal is formed in a wafer.

4. A compound semiconductor gallium arsenide single crystal grown by the liquid encapsulated Czochralski method having an egg-shaped etch pit density revealed in said single crystal by an AB etchant of less than $5 \times 10^4$ cm$^{-2}$.

5. A semiconductor device wherein a wafer of said single crystal according to claim 4 is used as a substrate for said device.

6. The compound semiconductor single crystal according to claim 4, wherein the egg-shape etch pit density is $5 \times 10^3$ cm$^{-2}$ or less.

7. A semiconductor device wherein a wafer of said single crystal according to claim 6 is used as a substrate for said device.

8. A method of heat treating a gallium arsenide semiconductor single crystal grown by a liquid-encapsulated Czochralski method having an egg-shaped etch pit density revealed in said single crystal by an AB etchant of less than $5 \times 10^4$ cm$^{-2}$ to reduce the egg-shaped etch pit density, comprising:
  subjecting said gallium arsenide single crystal to an annealing heat treatment in a temperature range of not less than 1100° C. and not more than its melting point of 1238° C.; and
  cooling said crystal at a cooling rate between 15° C. and 30° C. per minute for reducing the density of the pits.

9. The method of claim 8, wherein the annealing heat treatment is at a temperature just below the melting point of 1238° C. of said crystal.

10. The method of claim 8, wherein the crystal is a cut piece of the ingot and the lower temperature is 138°

C. lower than the melting point of 1238° C. of the crystal.

11. The method of claim 8, including maintaining the temperature of said crystal between 1100° C. and 1235° C. for five hours.

12. The method of claim 9, including maintaining the temperature of said crystal between 1100° C. and 1235° C. for five hours.

* * * * *